United States Patent
Chen et al.

(10) Patent No.: US 11,832,418 B2
(45) Date of Patent: Nov. 28, 2023

(54) LIQUID COOLING MODULE AND ITS LIQUID COOLING HEAD

(71) Applicant: Auras Technology Co., Ltd., New Taipei (TW)

(72) Inventors: Chien-Yu Chen, New Taipei (TW); Tian-Li Ye, New Taipei (TW); Yu Chen, New Taipei (TW); Jen-Hao Lin, New Taipei (TW); Chien-An Chen, New Taipei (TW); Yun-Kuei Lin, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 272 days.

(21) Appl. No.: 17/213,605

(22) Filed: Mar. 26, 2021

(65) Prior Publication Data

US 2021/0307198 A1 Sep. 30, 2021

Related U.S. Application Data

(60) Provisional application No. 63/038,191, filed on Jun. 12, 2020, provisional application No. 63/000,511, filed on Mar. 27, 2020.

(30) Foreign Application Priority Data

Feb. 22, 2021 (TW) .................................. 110106161

(51) Int. Cl.
*H01L 23/473* (2006.01)
*H05K 7/20* (2006.01)

(52) U.S. Cl.
CPC ..... *H05K 7/20272* (2013.01); *H05K 7/20254* (2013.01); *H05K 7/20263* (2013.01); *H05K 7/20281* (2013.01)

(58) Field of Classification Search
CPC .......... H01L 23/473; F28D 2021/0028–0031; H05K 7/20281; H05K 7/20272; H05K 7/20263; H05K 7/20254; H05K 7/20218
See application file for complete search history.

(56) References Cited

U.S. PATENT DOCUMENTS 10,048,008 B1 * 8/2018 Mounioloux ....... F28D 1/05391
10,602,640 B1 * 3/2020 Tsai ................... H05K 7/20254
(Continued)

*Primary Examiner* — Frantz F Jules
*Assistant Examiner* — Jason N Thompson
(74) *Attorney, Agent, or Firm* — Muncy, Geissler, Olds & Lowe, P.C.

(57) ABSTRACT

A liquid cooling head includes a chassis, an inlet channel, a thermally-conducting structure, a liquid gathering structure, a drain channel and a pump set. The chassis includes a lower chamber and an upper chamber communicated with the lower chamber through a connection opening. The inlet channel is disposed on one side of the chassis, and communicated with the upper chamber for radiating the heat of the working fluid away. The thermally-conducting structure is disposed in the lower chamber for gathering the working fluid passed through the thermally-conducting structure. The drain channel is disposed on one side of the chassis to be communicated with the lower chamber. The pump set for pushing the working fluid in the lower chamber to discharge the working fluid outwards from the drain channel.

13 Claims, 16 Drawing Sheets

(56) References Cited

U.S. PATENT DOCUMENTS

| | | | |
|---|---|---|---|
| 2006/0171801 A1* | 8/2006 | Manabe | H01L 23/473 |
| | | | 415/176 |
| 2006/0185378 A1* | 8/2006 | Duan | H05K 7/20263 |
| | | | 62/259.2 |
| 2007/0034356 A1* | 2/2007 | Kenny | G06F 1/20 |
| | | | 257/E23.098 |
| 2007/0110592 A1* | 5/2007 | Liu | F04D 5/002 |
| | | | 417/313 |
| 2009/0044929 A1* | 2/2009 | Yeh | F28D 15/00 |
| | | | 165/104.19 |
| 2015/0292817 A1* | 10/2015 | Shimanuki | F28D 1/0391 |
| | | | 165/173 |
| 2017/0045300 A1* | 2/2017 | Boday | H05K 7/20254 |
| 2017/0235350 A1* | 8/2017 | Tsai | G06F 1/20 |
| | | | 165/80.4 |
| 2017/0325357 A1* | 11/2017 | Tsai | F28F 9/002 |
| 2018/0340744 A1* | 11/2018 | Tsai | H05K 7/20272 |
| 2020/0214172 A1* | 7/2020 | Chen | H05K 7/20272 |

\* cited by examiner

LIQUID COOLING MODULE AND ITS LIQUID COOLING HEAD

RELATED APPLICATIONS

This application claims priority to U.S. Provisional Application Ser. No. 63/000,511, filed Mar. 27, 2020, and U.S. Provisional Application Ser. No. 63/038,191, filed Jun. 12, 2020, and Taiwanese Application Serial Number 110106161, filed Feb. 22, 2021, which are herein incorporated by reference.

BACKGROUND

Field of Disclosure

The present disclosure relates to a heat dissipation module. More particularly, the present disclosure relates to a liquid cooling module and its liquid cooling head.

Description of Related Art

With increasing development of science technology, various electrical devices (e.g., notebook computers, desktop computers and network servers etc.) have become indispensable roles in the daily lives of people. Generally, during the operation of the electrical components arranged inside these products, temperatures thereof will be gradually increased, and high temperatures may easily damage the electrical components. Therefore, a heat dissipation mechanism is a very important and necessary design for each of these electronic products. One of conventional heat dissipating mechanisms normally is practiced with a fan that is used to produce airflow to cool the electrical component through convection, or a heat dissipating unit with special material that is attached on the electrical component to thermally dissipate and conduct. Also, a water-cooling heat dissipation mechanism is another effective and common one of the conventional heat dissipating mechanisms.

Generally speaking, the principle of the liquid cooling heat dissipation mechanism is to perform a continuous thermal-dissipating circulation in an operation system using liquid (e.g. water or coolant) as a heat dissipation medium by continuously operating pumps. The liquid can flow in closed pipelines, and these closed pipelines are distributed on the surface of the electrical components (e.g., central processing unit) in the operation system. When liquid with relatively low temperature flows over the electrical components with relatively high temperature, the liquid absorbs heat energy to slow down the elevation of the temperature. Next, the heat energy of the liquid can be thermally exchanged by exterior or other heat dissipating mechanism through the closed pipeline for decreasing the temperature.

However, because the internal space of general computer equipment, host or server equipment is not much, it can only be practiced in the original space of the environment. Furthermore, the liquid cooling heat dissipation mechanism must be installed with pipeline having inflow and outflow design, which makes the installation of the pipeline relatively complicated. Therefore, there is a need to design a liquid cooling heat dissipation module with enhanced heat-dissipating efficacy for achieving the main purpose of development, that is able to collectively allocate overall pipeline configuration, reduce the occupied space of the piping system to arrange the construction in a narrow environment, and effectively complete the connection with other pipelines to avoid water leakage.

SUMMARY

One aspect of the present disclosure is to provide a liquid cooling module and its liquid cooling head to solve the aforementioned problems of the prior art.

In one embodiment of the present disclosure, a liquid cooling head is provided, and includes a chassis, a first inlet channel, a thermally-conducting structure, a liquid gathering structure, a drain channel and a pump set. The chassis includes a housing, a blocking plate and a base which are assembled together in sequence. An upper chamber is formed between the housing and the blocking plate, a lower chamber is formed between the blocking plate and the base, and a connection opening is formed on the blocking plate and communicated with the upper chamber and the lower chamber that are stacked with each other. The first inlet channel is disposed on one side of the housing, and communicated with the upper chamber for feeding a working fluid into the upper chamber from a source. The thermally-conducting structure is disposed within the lower chamber, and sandwiched between the blocking plate and the base for radiating the heat of the working fluid away. The liquid gathering structure is disposed within the lower chamber for gathering the working fluid passed through the thermally-conducting structure. The drain channel is disposed on one side of the housing and communicated with the lower chamber. The pump set pushes the working fluid in the lower chamber to discharge the working fluid outwards from the drain channel.

According to one or more embodiments of the present disclosure, the liquid cooling head further includes a second inlet channel. The second inlet channel is disposed on another side of the housing, and communicated with the upper chamber for feeding a working fluid into the upper chamber from another source. The first inlet channel and the second inlet channel are oppositely arranged on the housing.

According to one or more embodiments of the present disclosure, in the liquid cooling head, the first inlet channel and the drain channel are arranged on the same side of the housing; or the first inlet channel and the drain channel are oppositely disposed on the housing.

According to one or more embodiments of the present disclosure, in the liquid cooling head, the blocking plate further includes at least one communication slit arranged between the connection opening and the first inlet channel, and communicated with the upper chamber and the lower chamber.

According to one or more embodiments of the present disclosure, in the liquid cooling head, the thermally-conducting structure includes a plurality of fins arranged abreast sequentially. The base is formed with a first flow-diverting structure and a second flow-diverting structure. The fins, the liquid gathering structure, the first flow-diverting structure and the second flow-diverting structure are collectively formed on one inner surface of the base facing towards the housing. The first flow-diverting structure and the second flow-diverting structure are disposed on the same side of the thermally-conducting structure for respectively diverting the working fluid passing through the fins to the liquid gathering structure. The liquid gathering structure is disposed between the first flow-diverting structure and the second flow-diverting structure.

According to one or more embodiments of the present disclosure, in the liquid cooling head, the liquid gathering structure includes a circular body and three flow channels. The circular body is disposed on the inner surface of the base, and the flow channels are respectively formed on a circular surface of the circular body facing towards the housing for respectively receiving the working fluid sent from the fins, the first flow-diverting structure and the second flow-diverting structure, respectively.

According to one or more embodiments of the present disclosure, in the liquid cooling head, the pump set includes a drive assembly and a fan blade assembly. The drive assembly is allowed to rotate the fan blade assembly with a contactless way. The fan blade assembly includes a fan blade and a shaft rod passing through the fan blade. The housing includes a partition sheet. The liquid gathering structure includes a shaft-rod holder. The shaft-rod holder is located at an intersection of the flow channels, and the partition sheet is sandwiched between the circular body and the fan blade to cover the flow channels, and the partition sheet is formed with a through hole, and the shaft rod passes through the through hole to be fixed on the shaft-rod holder. The housing is formed with an upper cavity and a lower cavity at two opposite surfaces of the housing, respectively. The upper cavity and the lower cavity are vertically aligned with each other and hermetically isolated. The drive assembly is received within the upper cavity, the fan blade assembly is received within the lower cavity, and rotatably disposed in the shaft holder and the lower cavity.

According to one or more embodiments of the present disclosure, the liquid cooling head further includes two external channels and a pipeline. The external channels are respectively located at two opposite sides of the housing. The pipeline is disposed within the upper chamber, connected to the external channels and hermetically isolated to the upper chamber.

According to one or more embodiments of the present disclosure, in the liquid cooling head, the blocking plate is formed with a groove, and the housing is formed with a pipe cover covering the groove to collectively form the pipeline.

According to one or more embodiments of the present disclosure, in the liquid cooling head, the housing includes a position-limited recess disposed within the upper chamber, concavely formed on an inner surface of a housing facing towards the blocking plate. The chassis further includes a position-limited rib monolithically connected to an outer surface of the pipe cover, and extending into the position-limited recess for positioning the pipe cover.

In one embodiment of the present disclosure, a liquid cooling module is provided, and includes a tower type liquid cooling device and the aforementioned liquid cooling head. The tower type liquid cooling device includes an upper reservoir, a lower reservoir, a heat dissipation stacked structure, a front pipeline and a rear pipeline. The upper reservoir includes an inlet, an outlet and a plurality of first chambers. One of the first chambers is connected to the inlet, another of the first chambers is connected to the outlet. The lower reservoir is vertically stacked on a top portion of the liquid cooling head, and the lower reservoir includes a plurality of second chambers that are isolated to each other. The heat dissipation stacked structure includes a plurality of heat dissipation fin sets and a plurality of fin tubes which are sandwiched between the upper reservoir and the lower reservoir. The fin tubes are parallel to each other, and sandwiched between two neighboring ones of the heat dissipation fin sets. The fin tubes are in communication with the upper reservoir and the lower reservoir respectively so that an S-type flow path is collectively formed within the upper reservoir, the heat dissipation stacked structure and the lower reservoir. The front pipeline is in communication with the inlet and the drain channel of the liquid cooling head. The rear pipeline is in communication with the outlet and the first inlet channel of the liquid cooling head.

According to one or more embodiments of the present disclosure, in the liquid cooling module, the tower type liquid cooling device further includes an external fan located on one side of the heat dissipation stacked structure, and fixed between the upper reservoir and the lower reservoir for outputting airflow towards the heat dissipation fin sets.

According to one or more embodiments of the present disclosure, in the liquid cooling module, the external fan and the first inlet channel of the liquid cooling head are collectively disposed on the same side of the liquid cooling module.

According to one or more embodiments of the present disclosure, the liquid cooling module further includes an outer casing. The outer casing is formed with an inclined plate expanding obliquely and outwardly at one side surface of the outer casing corresponding to the first inlet channel.

Thus, through the construction of the embodiments above, In addition to achieving good heat dissipation efficiency, the present disclosure is also beneficial to be applied to related computer equipment, host or server equipment.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1A:
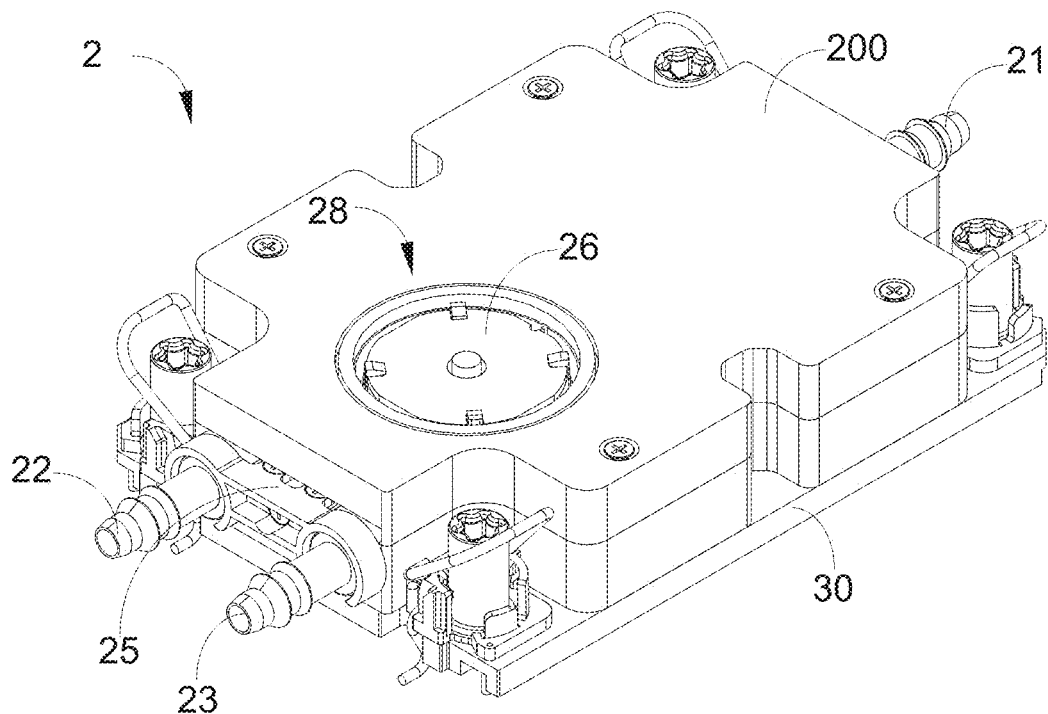
FIG. 1A and FIG. 1B are three-dimensional schematic views of liquid cooling heads according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 1B:
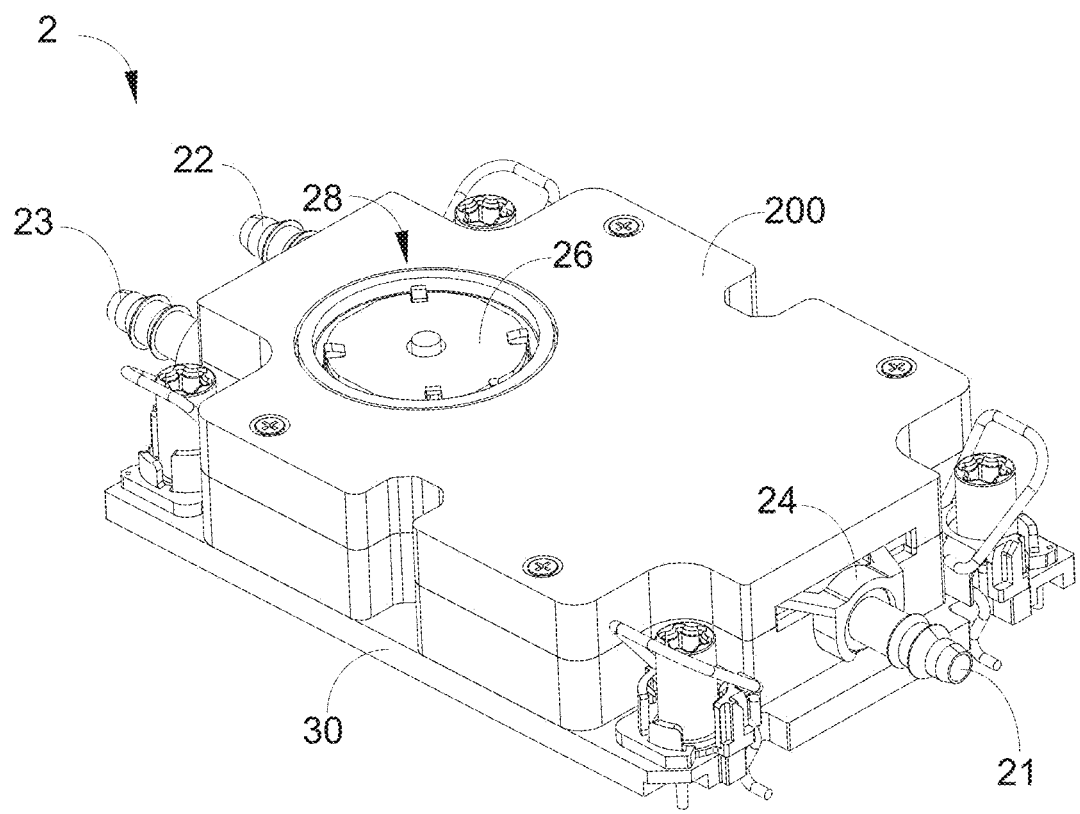
Figure 1C:
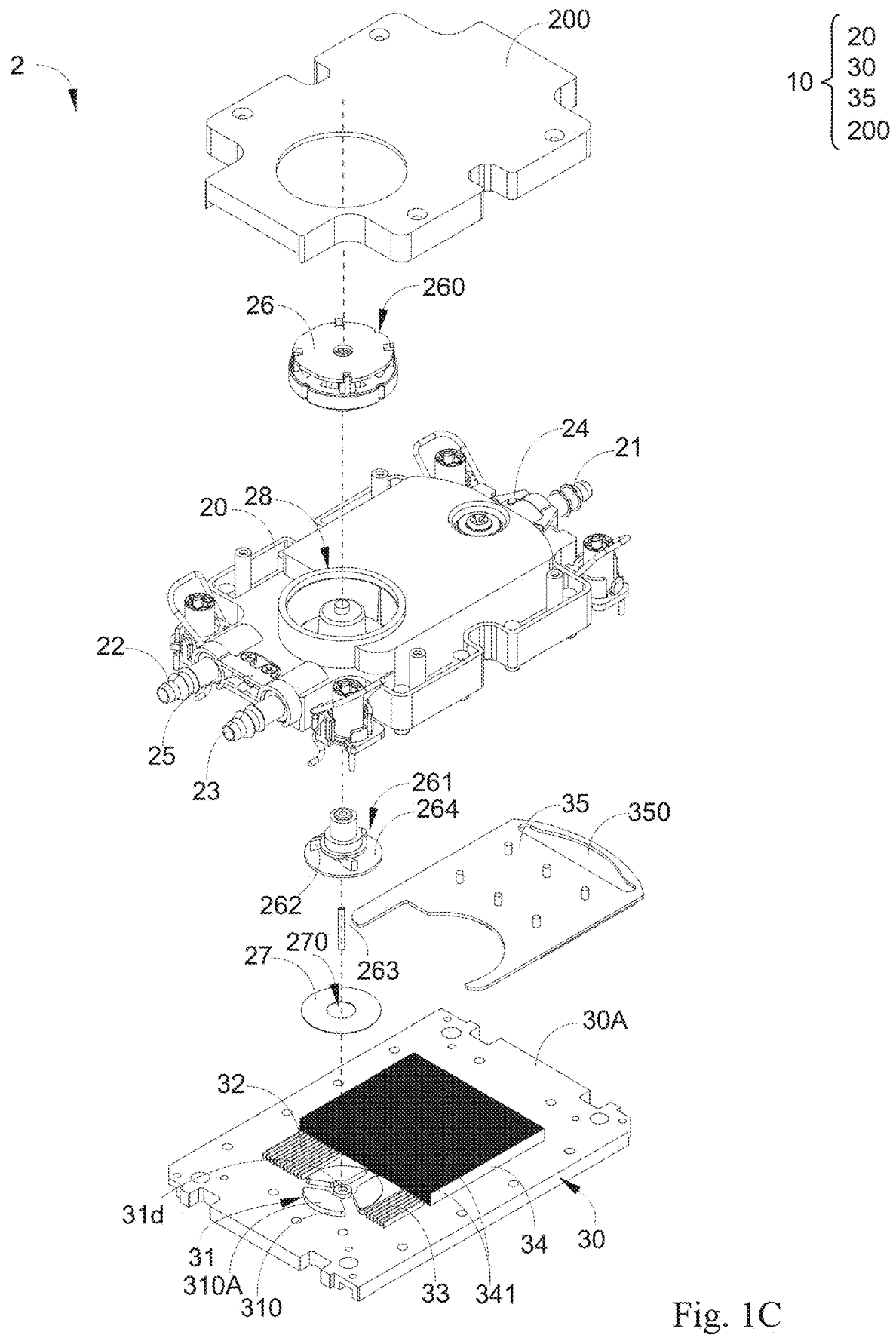
FIG. 1C is an exploded view of the liquid cooling head of the embodiment.
Figure 1D:
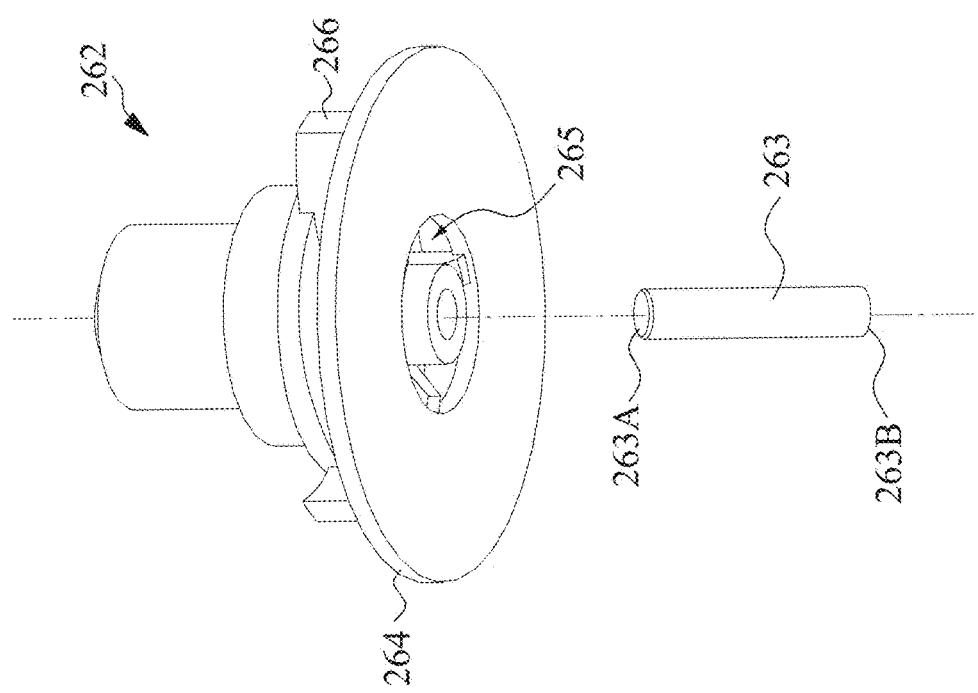
FIG. 1D is a three-dimensional schematic view of a fan blade assembly of the embodiment.
Figure 2A:
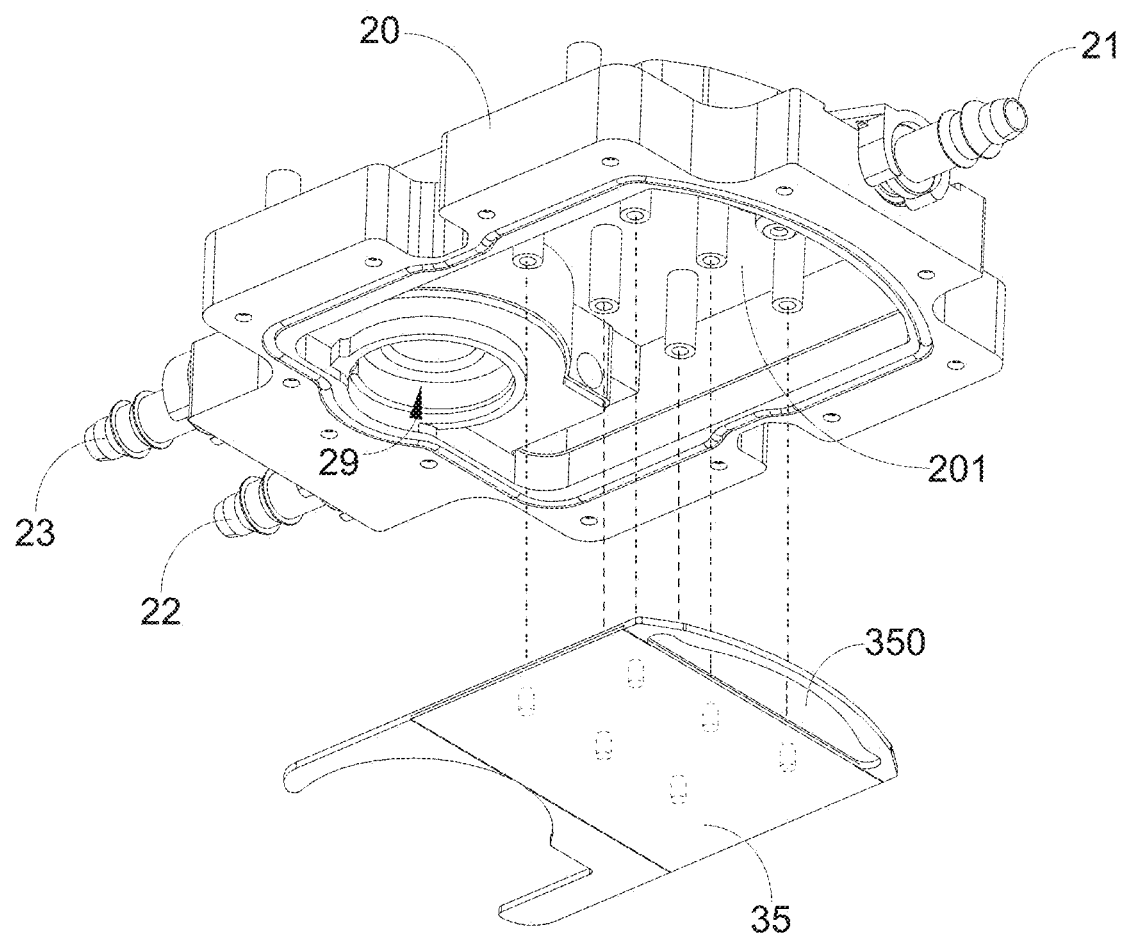
FIG. 2A is an assembling schematic view of the housing and the blocking plate of the embodiment.
Figure 2B:
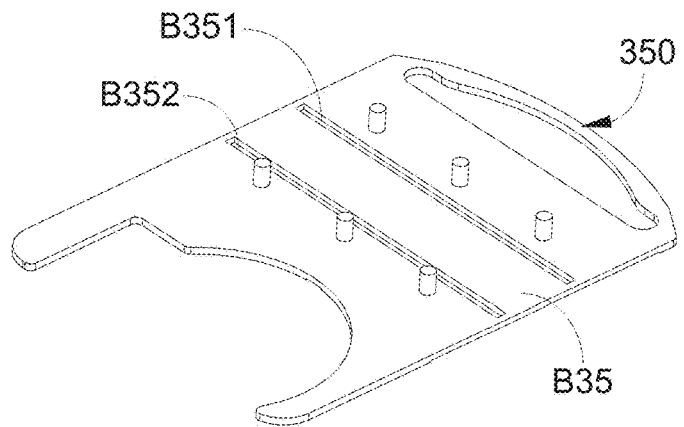
FIG. 2B to FIG. 2D are modified schematic views of varied blocking plates.
Figure 2C:
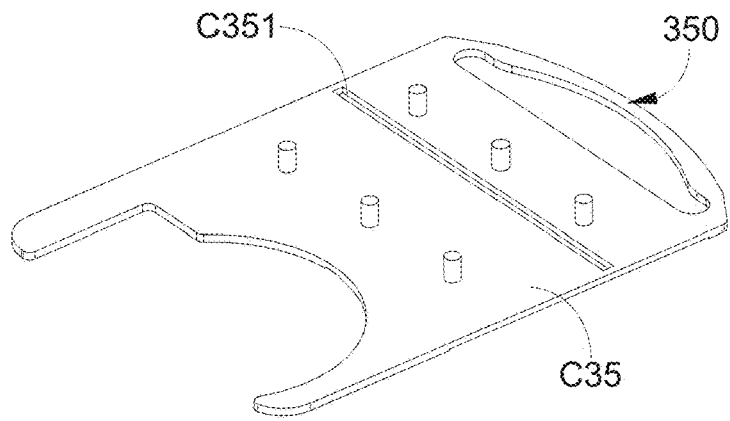
Figure 2D:
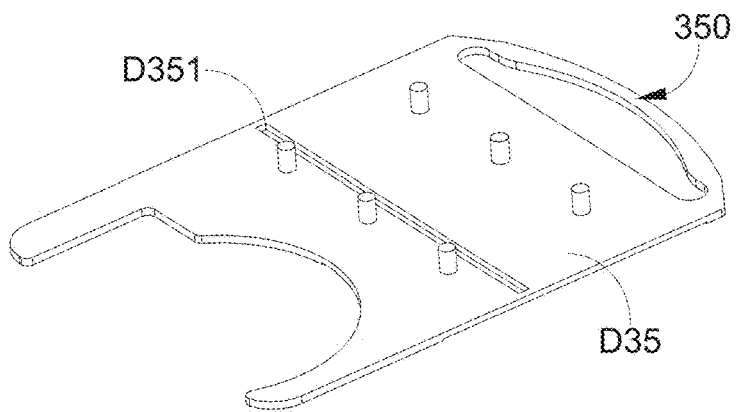

One embodiment is now illustrated to describe the implementation of a liquid cooling head 2 provided in the present disclosure. Reference is now made to FIG. 1A to FIG. 4B, in which FIG. 1A and FIG. 1B are three-dimensional schematic views of liquid cooling heads 2 according to one embodiment of the present disclosure; FIG. 1C is an exploded view of the liquid cooling head 2 of the embodiment; FIG. 1D is a three-dimensional schematic view of a fan blade assembly 261 of the embodiment; FIG. 2A is an assembling schematic view of the housing 20 and the blocking plate 35 of the embodiment; FIG. 2B to FIG. 2D are modified schematic views of varied blocking plates; FIG. 3A to 3D are a schematic view of the flow direction of working fluid in the liquid cooling head 2; FIG. 4A and FIG. 4B are arrangement schematic views of a base 30 and a liquid gathering structure 31 of the embodiment.

Refer to FIG. 1A to FIG. 1C, the liquid cooling head 2 mainly includes a chassis 10, a pump set 26, a first inlet channel 21, a second inlet channel 22 and a drain channel 23. The pump set 26 includes a drive assembly 260 and a fan blade assembly 261. The chassis 10 includes a upper cover 200, a housing 20, a blocking plate 35 and a base 30 which are assembled together in sequence. An upper chamber (e.g., water storage cavity 201) is formed between the housing 20 and the blocking plate 35. A lower chamber 301 is formed between the blocking plate 35 and the base 30. The upper chamber (e.g., water storage cavity 201) and the lower chamber are stacked with each other. Two opposite surfaces of the housing 20 are formed with an upper cavity 28 and a lower cavity 29, respectively. The upper cavity 28 is used to receive the drive assembly 260. The lower cavity 29 and the upper cavity 28 are vertically aligned with each other, and the lower cavity 29 and the upper cavity 28 are hermetically isolated. The lower cavity 29 is used to receive the fan blade assembly 261. The drive assembly 260 is allowed to rotate the fan blade assembly 261 with a contactless way. For example, the drive assembly 260 is allowed to magnetically induce the fan blade assembly 261 to rotate with a contactless way.

The housing 20 is a main part of the liquid cooling head 2. One end of the housing 20 is disposed in the first inlet channel 21 for feeding a working fluid from a source, and the other end of the housing 20 is disposed in the second inlet channel 22 and the drain channel 23, namely, the second inlet channel 22 and the drain channel 23 are disposed on the same side of the housing 20, and the first inlet channel 21 is oppositely disposed on the housing 20, and the second inlet channel 22 is used to feed another working fluid from another source. The housing 20 is formed with a machine cavity for receiving the drive assembly 260 therein. The liquid cooling head 2 further includes a single-hole locking ring 24 and a dual-hole locking ring 25 with a specific thickness. The single-hole locking ring 24 is used to fix the first inlet channel 21, and the dual-hole locking ring 25 is used to fix the second inlet channel 22 and the drain channel 23 for preventing from water leakage at the junction of the first inlet channel 21 and the drain channel 23.

The housing 20 is disposed between the upper cover 200 and the base 30, and the blocking plate 35 is disposed between the housing 20 and the base 30. An inner surface 30A of the base 30 facing towards the housing is provided with a liquid gathering structure 31, a first flow-diverting structure 32, a second flow-diverting structure 33 and a thermally-conducting structure 34. The thermally-conducting structure 34 includes a plurality of fins 341 arranged abreast sequentially. The liquid gathering structure 31 is disposed between the first flow-diverting structure 32 and the second flow-diverting structure 33. The liquid gathering structure 31, the first flow-diverting structure 32 and the second flow-diverting structure 33 are connected to the thermally-conducting structure 34, or the same side adjacent to the thermally-conducting structure 34. The first flow-diverting structure 32 and the second flow-diverting structure 33 are collectively formed on the inner surface 30A of the base 30. Furthermore, the housing 20 of the chassis 10 further includes a partition sheet 27, the partition sheet 27 can assist the liquid gathering structure 31 to collect working fluid (e.g., water) and prevent the working fluid from flowing back. The partition sheet 27 is disposed between the fan blade assembly 261 and the liquid gathering structure 31. The partition sheet 27 is formed with a through hole 270, and the partition sheet 27 is a copper sheet. However, the disclosure is not limited thereto.

As shown in FIG. 1C and FIG. 2A, after the blocking plate 35 is assembled to the housing 20, the water storage cavity 201, for example, is formed between the housing 20 and the blocking plate 35 for temporarily storing the working fluid. The blocking plate 35 is arranged above the thermally-conducting structure 34 to separate the water storage cavity 201 located as a upper layer, and the lower chamber 301 receiving the thermally-conducting structure 34 and located as a lower layer (see FIG. 3A to FIG. 3C). The blocking plate 35 is further formed with a connection opening 350 being communicated with the water storage cavity 201 located as the upper layer, and the lower chamber 301 located as the lower layer. Thus, after the working fluid flows into the water storage cavity 201 from the first inlet channel 21 or the second inlet channel 22, the working fluid can then downwardly flow into the lower chamber 301 through the connection opening 350.

However, the concept of the disclosure is not limited to this, that is, the related communication structure of the blocking plate 35 can also be designed in other ways. For example, three blocking plates B35, C35 and D35 are shown in FIG. 2B to FIG. 2D, respectively. The blocking plate B35 is formed with two communication slits B351 and B352 in FIG. 2B, and the blocking plate C35 is formed with a communication slit C351 in FIG. 2C, and the blocking plate D35 is formed with a communication slit D351 in FIG. 2D. The communication slits B351、B352、C351、D351 are respectively arranged between the connection opening 350 and the second inlet channel 22.

Therefore, the working fluid can downwardly pass through each of the communication slits B351、B352、C351、D351, respectively. It is noted, depending on the flow speed of the working fluid or the water pressure of delivering the working fluid, the working fluid may first pass through the communication slit described above, or through the connection opening 350 that is relatively far away. In other words, the above-mentioned communication slit and the original connection opening 350 are adopted in the present disclosure can produce a flow-splitting effect, so that the working fluid with relatively low temperature can be evenly guided to the thermally-conducting structure 34 or the lower chamber 301 can thermally exchange with the thermally-conducting structure 34, so that the liquid cooling head 2 can perform equal temperature therein. Of course, the position, shape, size, or number of the above-mentioned communication slits are not limited to those shown in FIG. 2B to FIG. 2D, and the shape can be, for example, square, triangle, circle or alike, and the edge of a through hole of various shapes can be wavy or jagged, etc.

Figure 3A:
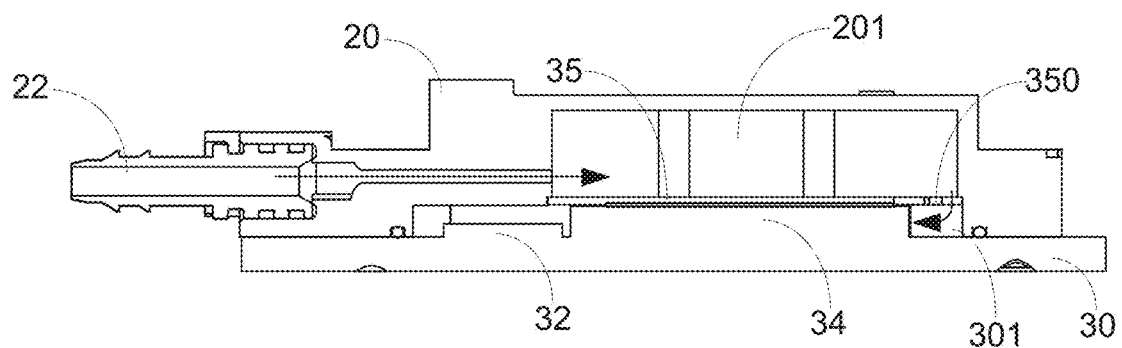
FIG. 3A to 3D are a schematic view of the flow direction of working fluid in the liquid cooling head.
Figure 3B:
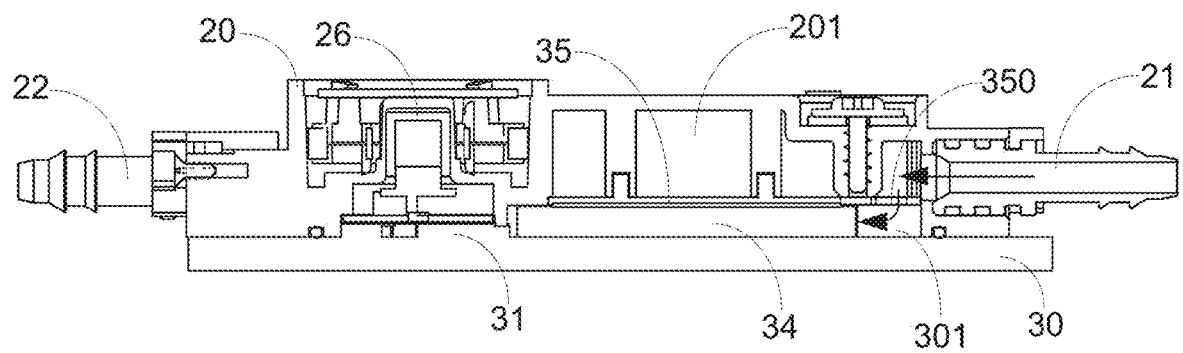
Figure 3C:
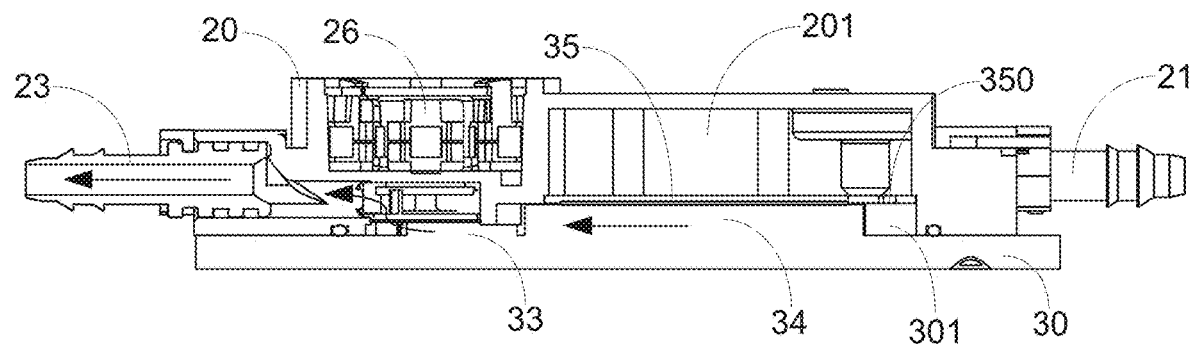
Figure 3D:
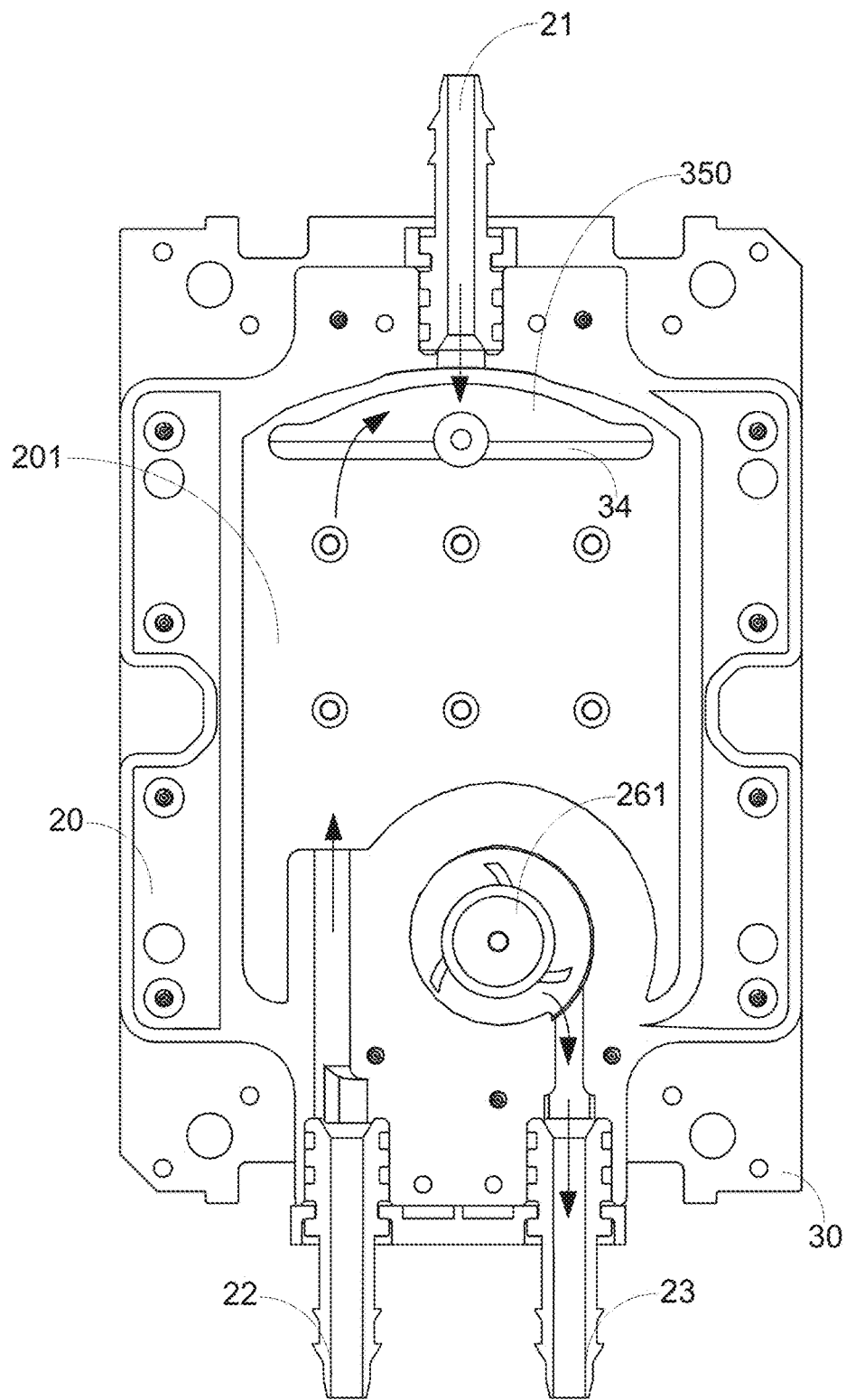
Figure 4A:
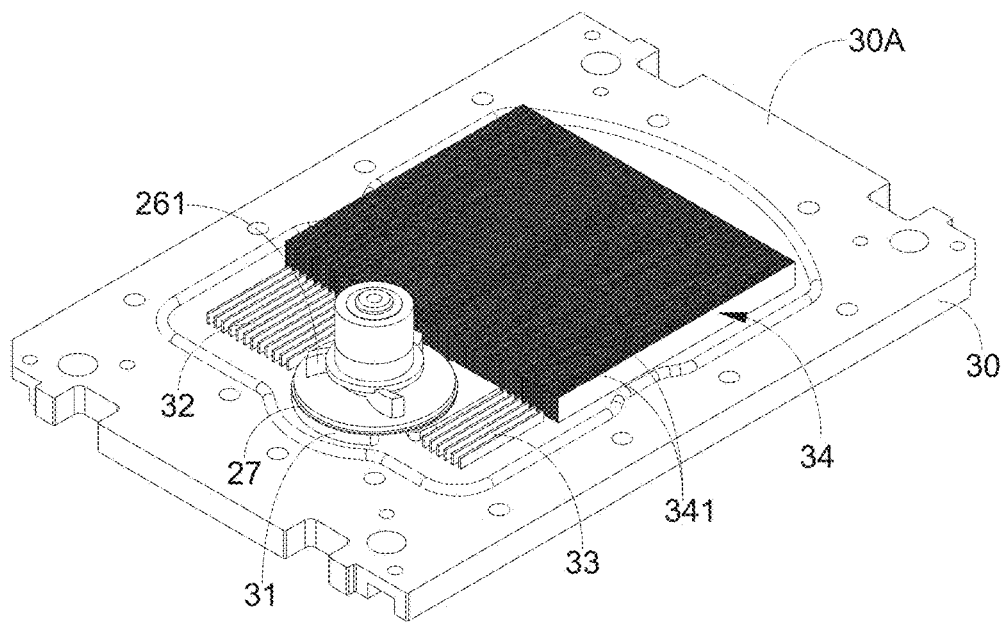
FIG. 4A and FIG. 4B are arrangement schematic views of a base and a liquid gathering structure of the embodiment.
Figure 4B:
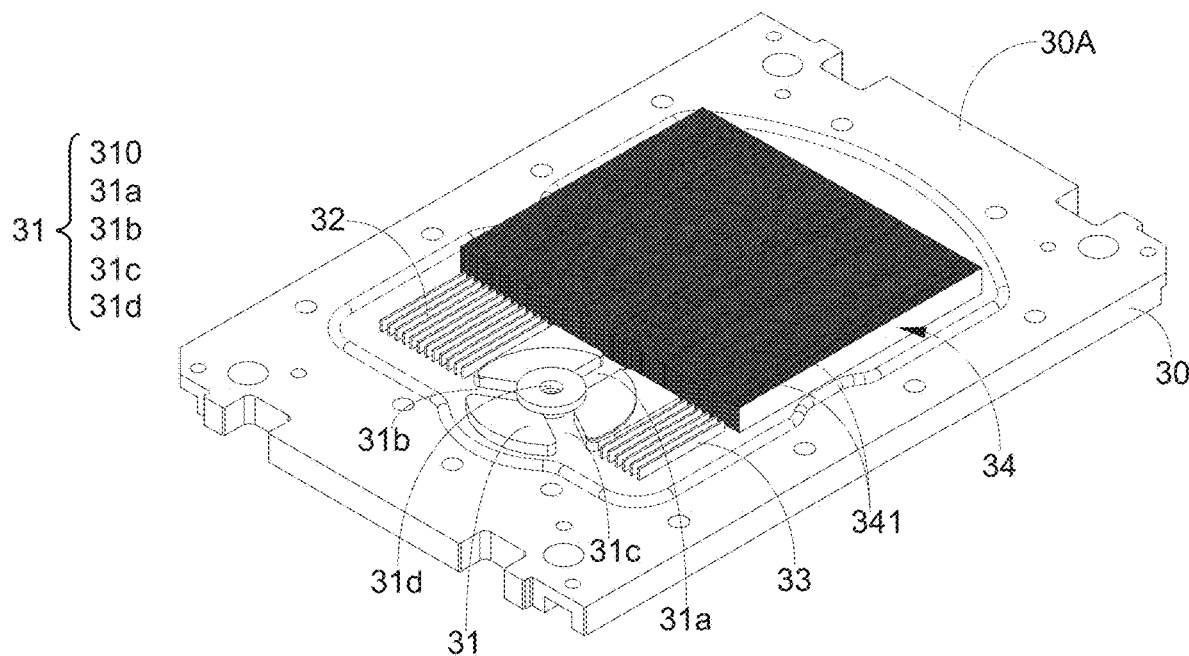

FIG. 3A is a vertical cross-sectional view showing the liquid cooling head 2 along the extension direction of the second inlet channel 22; FIG. 3B is a vertical cross-sectional view showing the liquid cooling head 2 along the extension direction of the first inlet channel 21; FIG. 3C is a vertical cross-sectional view showing the liquid cooling head 2 along the extension direction of the drain channel 23; FIG. 3D is a horizontal cross-sectional view showing the liquid cooling head 2 along the direction of the first inlet channel 21, the second inlet channel 22 and the drain channel 23. The flow of the working fluid is shown in the direction of the arrows in FIG. 3A to FIG. 3D. The lower chamber 301 is jointly defined by the housing 20, the blocking plate 35 and the base 30. Besides the thermally-conducting structure 34, the liquid gathering structure 31, the first flow-diverting structure 32 and the second flow-diverting structure 33 are also received within the lower chamber 301.

As shown in FIG. 3A to FIG. 3D, the working fluid which enters the liquid cooling head 2 can either flow into the liquid cooling head 2 from the first inlet channel 21, or the second inlet channel 22. The working fluid from the second inlet channel 22 will flow into the water storage cavity 201 first, and then divert downwardly to the lower chamber 301 through the connection opening 350. A part of the working fluid from the first inlet channel 21 may flow into the lower chamber 301 first, and another part thereof may directly divert downwardly to the lower chamber 301 through the connection opening 350. Next, the working fluid can enter into the interior of the thermally-conducting structure 34 to thermally exchange with the thermally-conducting structure 34. Finally, the working fluid flows below the fan blade assembly 261, and is sucked upwardly by the hollow part in the chassis of the fan blade assembly 261, thereby flowing outwards the liquid cooling head 2 from the adjacent drain channel 23.

FIG. 4A illustrates the fan blade assembly 261 and the partition sheet 27 installed on the liquid cooling head 31. As mentioned above, the liquid gathering structure 31 is located between the first flow-diverting structure 32 and the second flow-diverting structure 33. Next, FIG. 4B illustrates the liquid gathering structure 31 includes three flow channels 31a, 31b, 31c and a shaft-rod holder 31d. The flow channels 31a, 31b, 31c are respectively formed on a circular surface 310A of the circular body 310 facing towards the housing 20. More specifically, the flow channels 31a, 31b, 31c are formed equiangularly on the circular surface 310A of the circular body 310 facing towards the housing 20. The flow channel 31a is directly connected to or adjacent to the thermally-conducting structure 34, and the flow channel 31b is adjacent to the first flow-diverting structure 32, and the flow channel 31c is adjacent to the second flow-diverting structure 33. However, the disclosure is not limited that the flow channels 31a, 31b, 31c have to be formed equiangularly on the circular body 310. The shaft-rod holder 31d is located at the intersection of the flow channels 31a, 31b, and 31c. Each of the first flow-diverting structure 32 and the second flow-diverting structure 33 is a multi-channel design, and the liquid cooling head 2 is a disc-shaped design. The fan blade assembly 261 is rotatably disposed within the shaft-rod holder 31d and the lower cavity 29.

As shown in FIG. 1D, the fan blade assembly 261 includes a fan blade 262 and a shaft rod 263 passing through the fan blade 262. The shaft rod 263 is provided with a bottom end 263B and a top end 263A opposite to each other. The shaft rod 263 is arranged in a manner such that the bottom end 263B of the shaft rod 263 is set at the shaft-rod holder 31d or the top end 263A of the shaft rod 263 is set within the lower cavity 29 of the housing 20 (FIG. 2A), and a ringed mylar gasket (not shown in Figures) can be installed on the shaft rod located between the fan blade 262 and the shaft-rod holder 31d so as to avoid damage formed between the fan blade 262 and the shaft-rod holder 31d when rotating. In one embodiment, the fan blade 262 of the fan blade assembly 261 includes a base plate 264 and a plurality of blades 266 arranged on the base plate 264. The base plate 264 has a hollow portion 265. When the fan blade assembly 261 rotates, the hollow portion 265 can suck the working fluid below the fan blade 262 upwardly, and then flows out of the liquid cooling head 2 from the adjacent drain channel 23, but it is not limited to this.

Specifically, the working fluid passing through the thermally-conducting structure 34 will flow out from a middle part and two both sides of the thermally-conducting structure 34. A part of the working fluid flowing out from the middle part of the thermally-conducting structure 34 will directly flow into the flow channel 31a, and another part of the working fluid flowing out from the both sides of the thermally-conducting structure 34 will flow into the first flow-diverting structure 32 or the second flow-diverting structure 33. Thus, within the structure assembled by the housing 20, the blocking plate 35 and the base 30 together, the working fluid flowing out from the first flow-diverting structure 32 can be guided to the flow channel 31b, and the working fluid flowing out from the second flow-diverting structure 33 can be guided to the flow channel 31c. Thus, through the design of the first flow-diverting structure 32, the second flow-diverting structure 33 and the liquid gathering structure 31, the flow guide and concentration effect of the working fluid can be effectively improved, so that the fan blade assembly 261 can be more beneficial for suction and drainage of the working fluid.

Figure 5A:
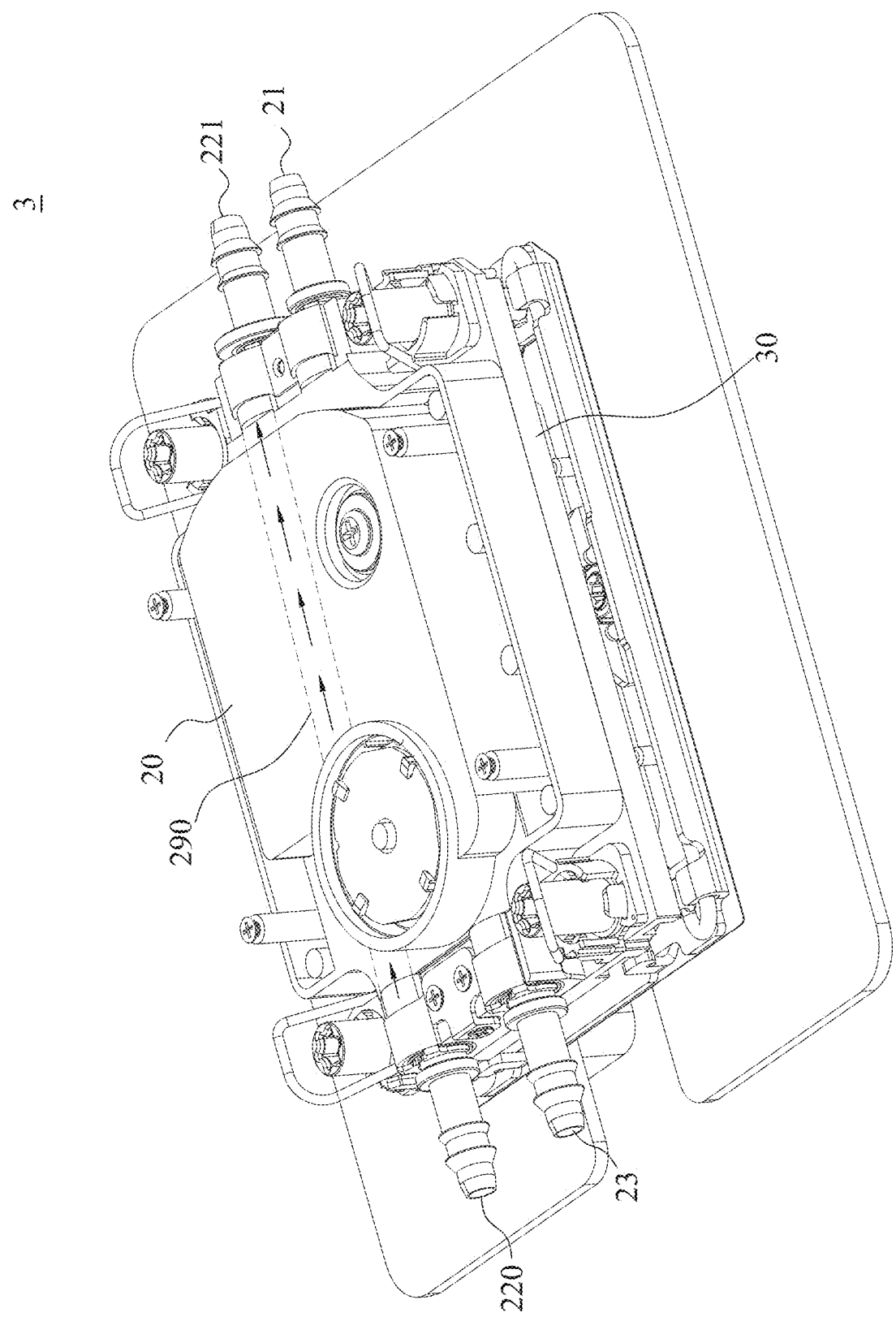
FIG. 5A is a three-dimensional schematic view of a liquid cooling head according to one embodiment.
Figure 5B:
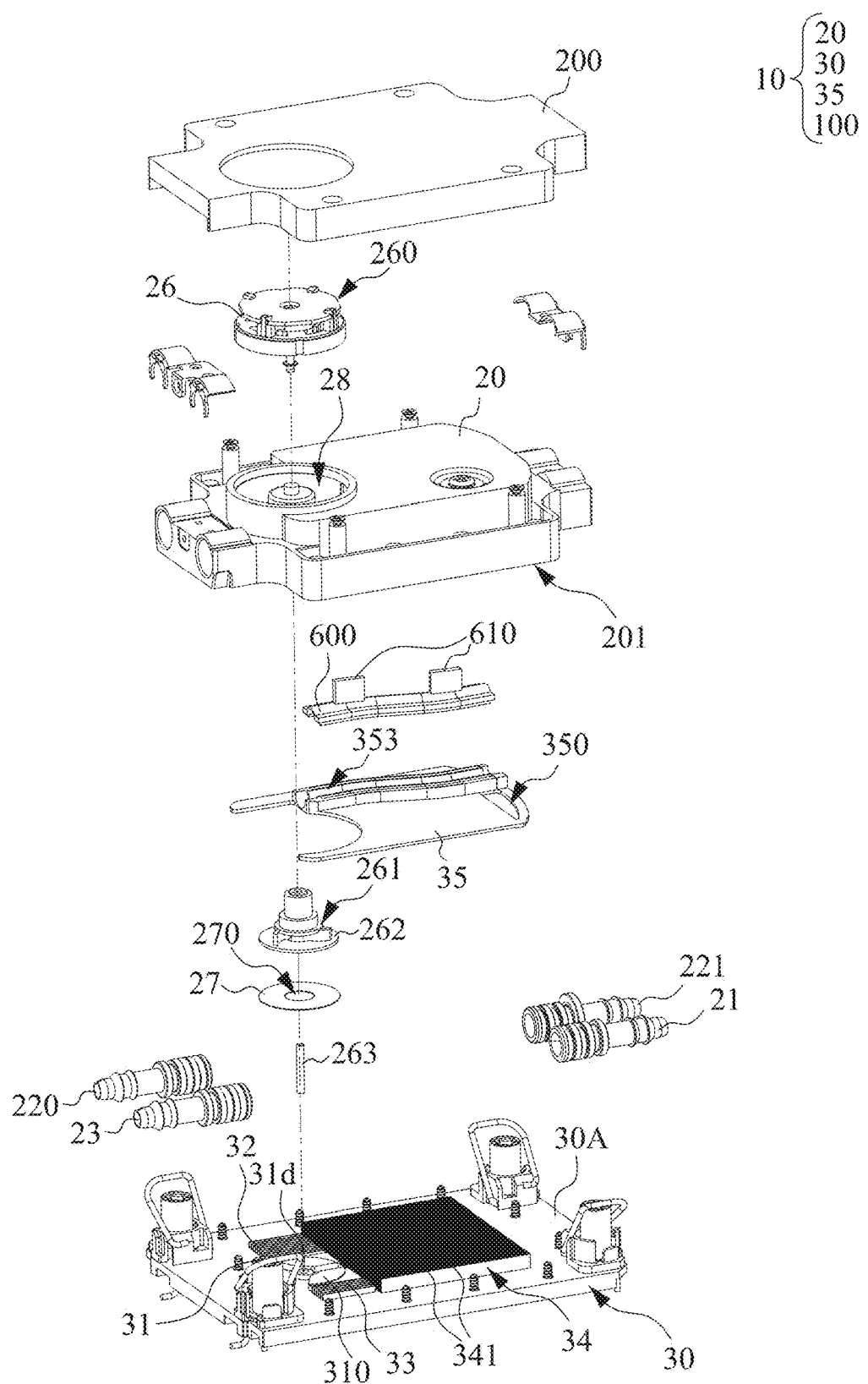
FIG. 5B is an exploded view of the liquid cooling head of the embodiment.

FIG. 5A is a three-dimensional schematic view of a liquid cooling head 3 according to one embodiment, and FIG. 5B is an exploded view of the liquid cooling head 3 of the embodiment. A shown in FIG. 5A and FIG. 5B, the liquid cooling head 3 is substantially the same to the liquid cooling head 2 described above, except that the liquid cooling head 3 is with an integrated double-cavity body, wherein the first inlet channel 21 and the drain channel 23 are located at two opposite sides of the housing 20, and are collectively located at one long half part of the housing 20. The liquid cooling head 3 further includes two external channels 220、221 and a pipeline 290. The external channels 220, 221 are respectively located at the opposite sides of the housing 20, and are collectively located at another long half part of the housing 20. In the embodiment, the number of inlet/outlet ports of the liquid cooling head 3 is increased to four, so that the pipeline water route can become more flexible, thereby reducing the space occupied by the pipeline 290 in the system. The pipeline 290 is fixedly located in the housing 20 (that is, in the water storage cavity 201), and is connected to the external channels 220 and 221, and is hermetically isolated from the water storage cavity 201. Other than the working fluid sent outwardly from the drain channel 23, the external channel 220 is used to send working fluid from another source (as indicated by the arrow in FIG. 5A), and flow out from the external channel 221 through the pipeline 290.

Figure 6:
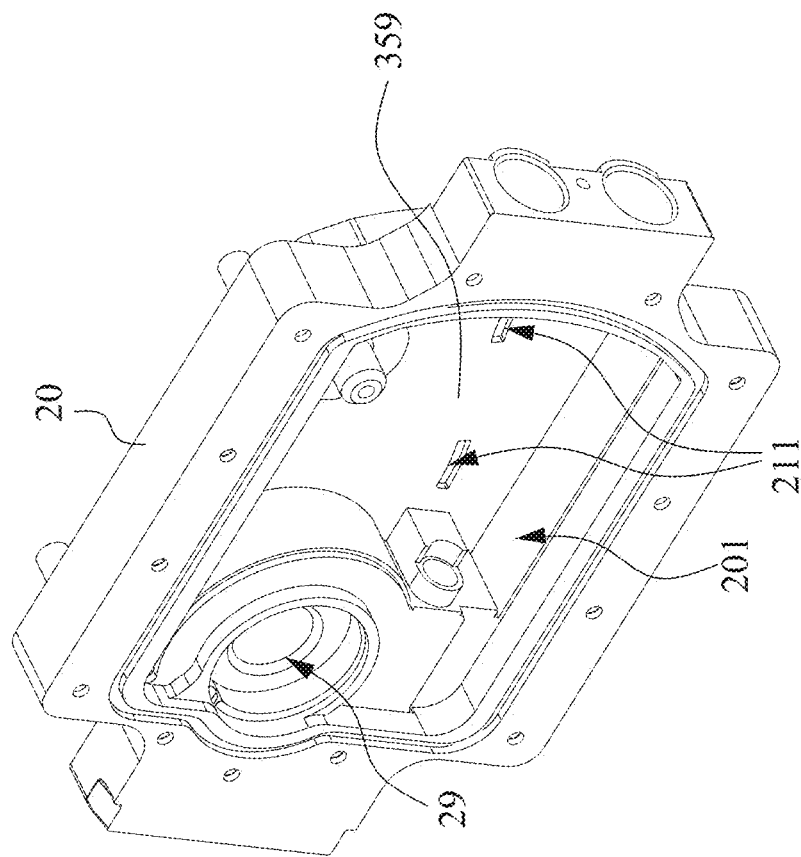
FIG. 6 is an exploded view of a housing of the liquid cooling head according to one embodiment.
Figure 6:
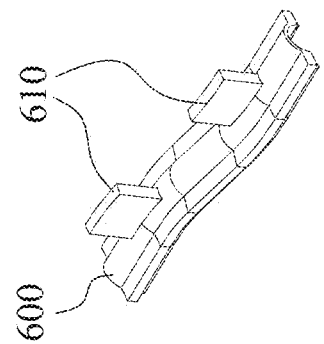

FIG. 6 is an exploded view of a housing 20 of the liquid cooling head according to one embodiment. As shown in FIG. 5B and FIG. 6, specifically, the blocking plate 35 is formed with a groove 353. The groove 353 is formed on one surface of the blocking plate 35 facing towards the housing 20. The housing 20 is formed with a pipe cover 600 covering the groove 353 to collectively form the aforementioned pipeline 290. The housing 20 includes two position-limited recesses 211 respectively disposed within the upper chamber (e.g., the water storage cavity 201), and each of the position-limited recesses 211 is concavely formed on an inner surface 359 of the housing 20 facing towards the blocking plate 35. The pipe cover 600 further includes two position-limited ribs 610. Each of the position-limited ribs 610 is monolithically connected to an outer surface of the pipe cover 600, and extends into one of the position-limited recesses 211 for positioning the pipe cover 600.

Figure 7A:
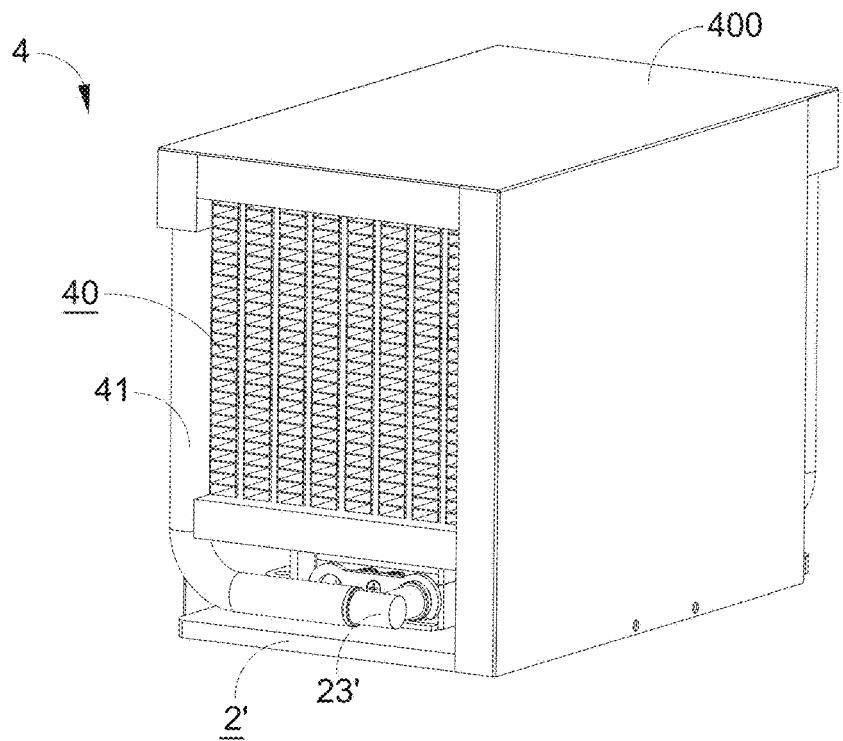
FIG. 7A to FIG. 7C are three-dimensional schematic views of a liquid cooling module according to one embodiment of the present disclosure.
Figure 7B:
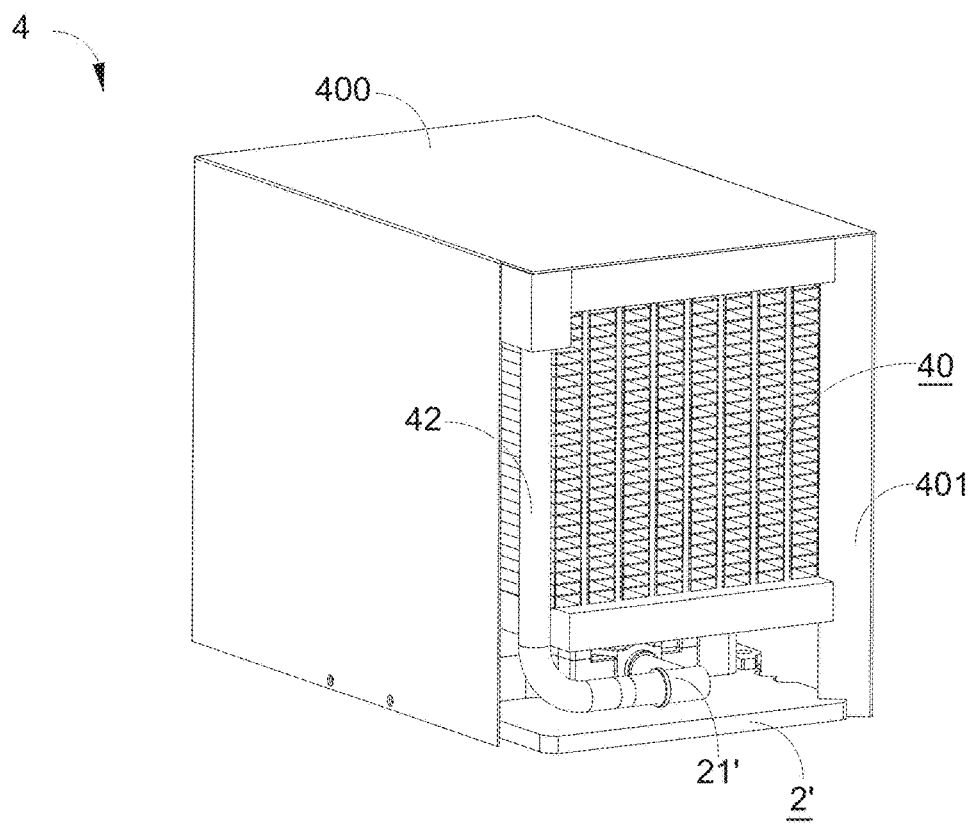
Figure 7C:
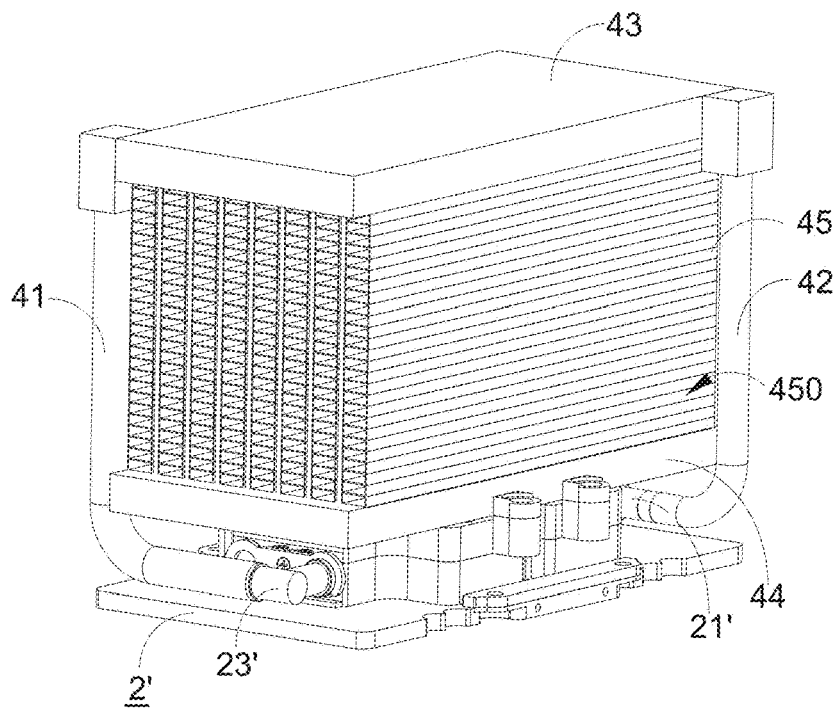
Figure 7D:
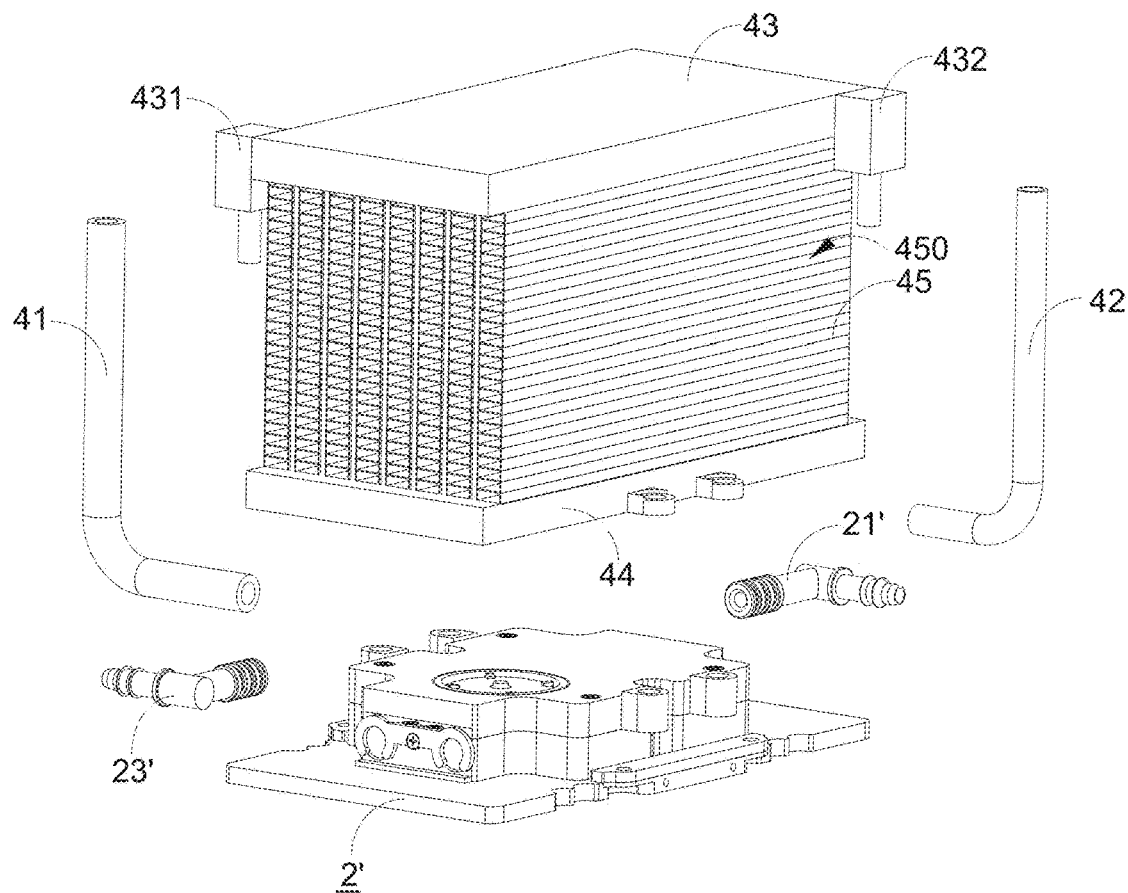
FIG. 7D is an exploded view of a liquid cooling module.
Figure 8A:
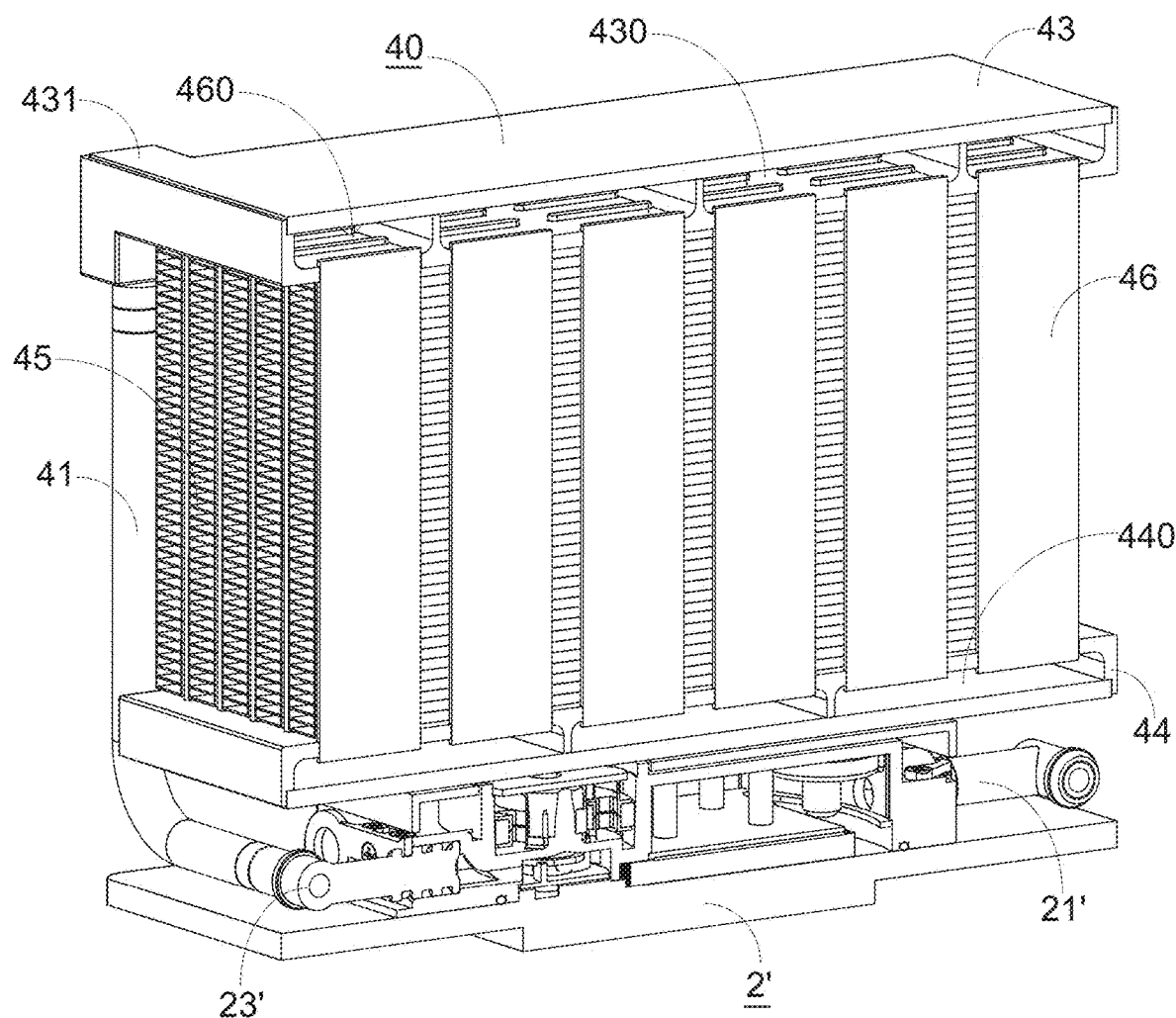
FIG. 8A is a three-dimensional schematic view of a liquid cooling module that is sectioned vertically.
Figure 8B:
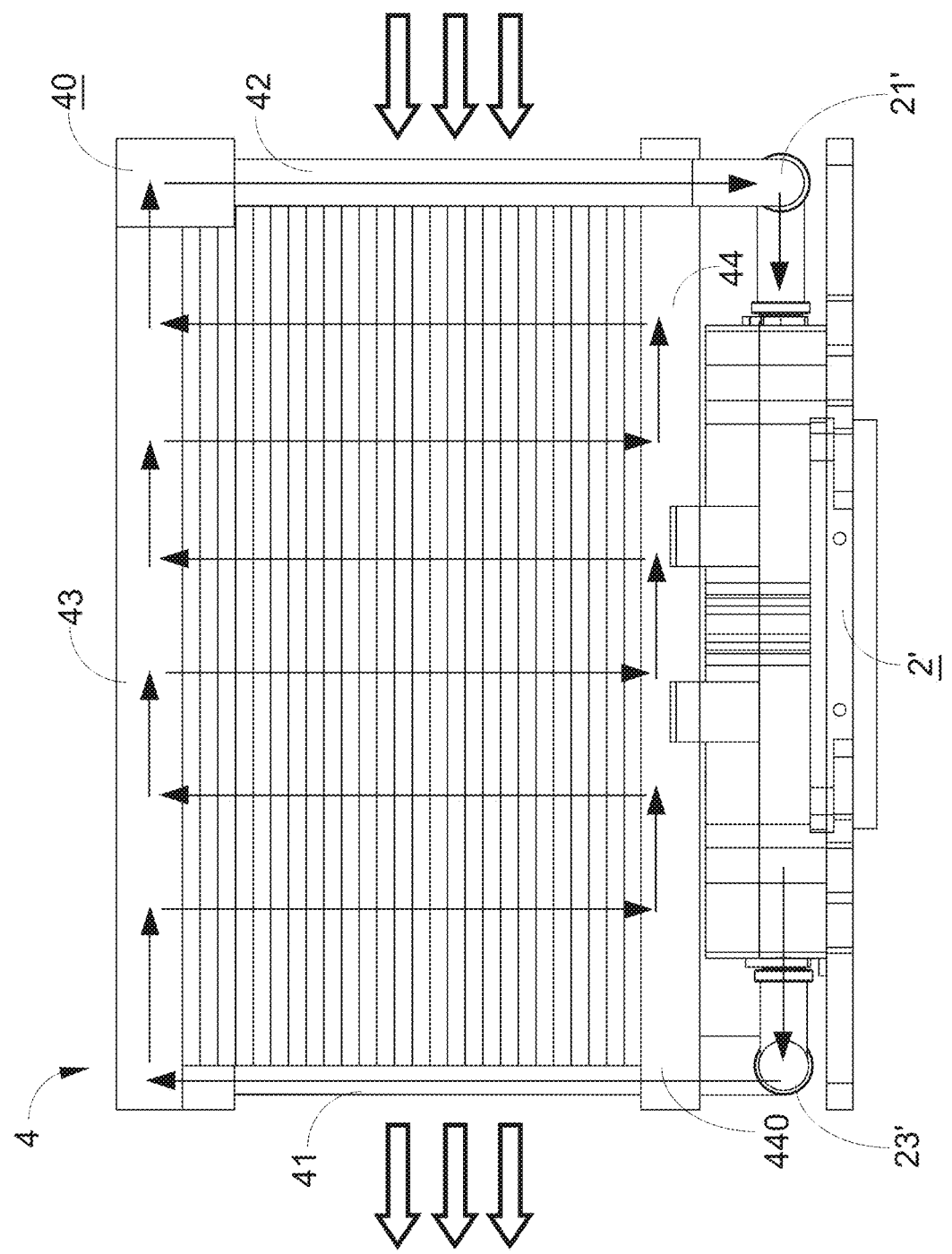
FIG. 8B is a schematic view of the flow direction of working fluid in the liquid cooling module.
Figure 9:
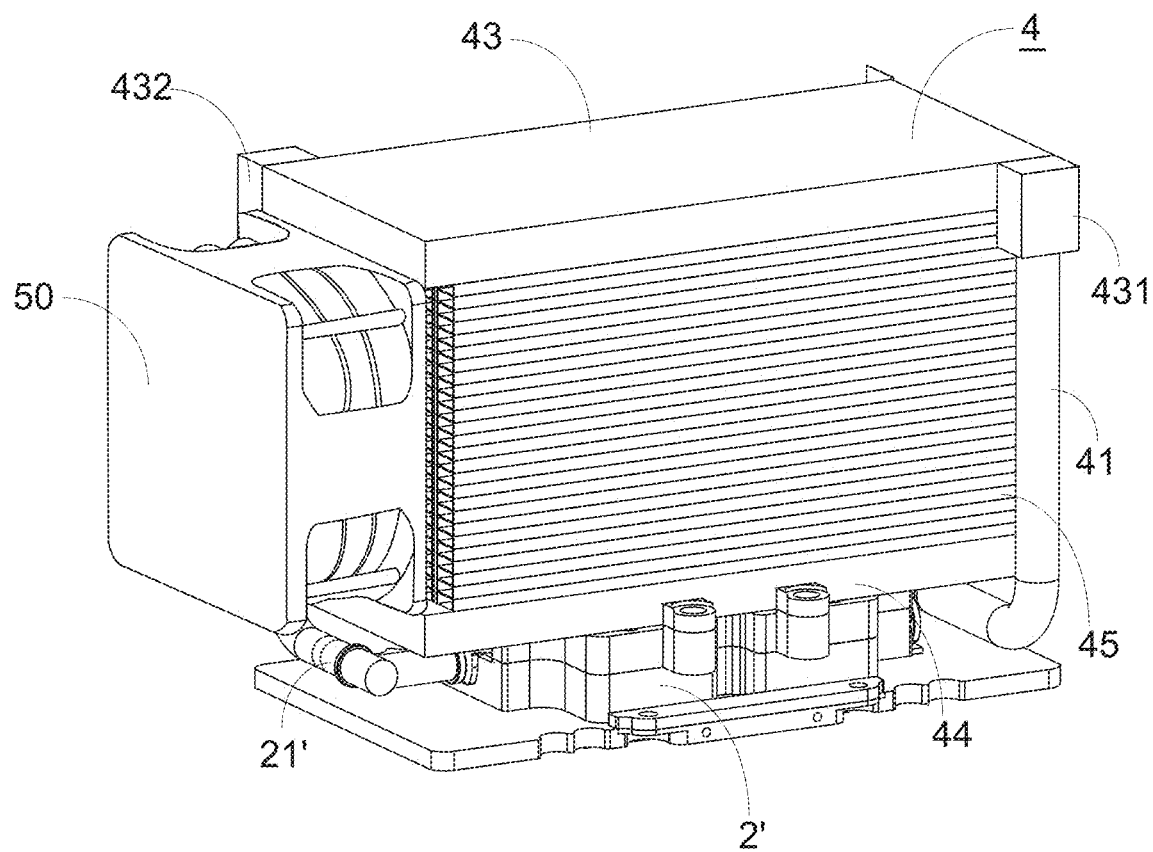
FIG. 9 is a configuration-schematic view of a liquid cooling module and an external fan.

An embodiment is now illustrated to describe the implementation of a liquid cooling module 4 provided in the present disclosure. Reference is now made to FIG. 7A to FIG. 9, in which FIG. 7A to FIG. 7C are three-dimensional schematic views of liquid cooling modules 4; FIG. 7D is an exploded schematic view of the liquid cooling modules 4; FIG. 8A is a three-dimensional schematic view of a liquid cooling module 4 that is sectioned vertically; FIG. 8B is a schematic view of the flow direction of working fluid in the liquid cooling module 4; and FIG. 9 is a configuration-schematic view of a liquid cooling module 4 and an external fan 50.

As shown in FIG. 7A to FIG. 7D, the liquid cooling module 4 basically includes two main parts. One of the main parts is a tower type liquid cooling device 40, and another is a liquid cooling head 2'. The tower type liquid cooling device 40 is vertically stacked on the liquid cooling head 2', and the liquid cooling head 2' of the embodiment is the aforementioned liquid cooling head described in the embodiment described above. However, in order to being vertical integrated on the tower type liquid cooling device 40, in this embodiment, the first inlet channel 21' and the drain channel 23' of the liquid cooling head 2' respectively use a L-shaped nozzle, the liquid cooling module 4 further includes a front pipeline 41 and a rear pipeline 42 so that the liquid cooling head 2', the front pipeline 41, the rear pipeline 42 and the tower type liquid cooling device 40 collectively form a water circulation arranged in an up-down direction.

Specifically speaking, the tower type liquid cooling device 40 further includes an upper reservoir 43, a lower reservoir 44 and a heat dissipation stacked structure 450. The upper reservoir 43 is formed with an inlet 431 and an outlet 432, wherein the upper reservoir 43 is connected to the front pipeline 41 by the inlet 431, and connected to the rear pipeline 42 by the outlet 432. Next, the front pipeline 41 is connected to the drain channel 23', the rear pipeline 42 is connected to the first inlet channel 21'. The heat dissipation stacked structure 450 includes a plurality of heat dissipation fin sets 45 which are sandwiched between the upper reservoir 43 and the lower reservoir 44. Each of the heat dissipation fin sets 45 is composed of a row of plural heat dissipation fins laminated between the upper reservoir 43 and the lower reservoir 44. It is reasonable that the combination of the tower type liquid cooling device 40 and the liquid cooling head 2' also needs to use or develop design related to any securing member or fixing structure to reinforce bonding strength between the tower type liquid cooling device 40 and the liquid cooling head 2'.

The liquid cooling module 4 respectively illustrated in FIG. 7A and FIG. 7B further includes an outer casing 400, and FIG. 8C and FIG. 8D respectively illustrate a perspective view and an exploded view of the liquid cooling module 4 that the outer casing 400 thereon is detached therefrom. As shown in FIG. 7A and FIG. 7B, two opposite sides of the outer casing 400 respectively corresponding to the drain channel 23' and the first inlet channel 21' are unshielded, that is, after the outer casing 400 is assembled thereon, the heat dissipation fin sets 45 (see FIG. 8A) may be exposed from the tower type liquid cooling device 40. Next, the front pipeline 41 and the rear pipeline 42 respectively located at the opposite sides further provide windshield functions. With the configuration of the outer casing 400, besides enabling the external air to flow into the airflow channels of the heat dissipation fin sets 45, the resistance of the air flow can be reduced to make the air flow more concentrated, thereby improving the air cooling effect of the heat dissipation fin sets 45.

Therefore, as shown in FIG. 7B, the outer casing 400 is further formed with an inclined plate 401 expanding obliquely and outwardly at one side surface of the outer casing 400 corresponding to the first inlet channel 21' to facilitate the concentrated flow of airflows.

As shown in FIG. 8A, the heat dissipation stacked structure 450 further includes a plurality of fin tube layers 460, each of the fin tube layers 460 includes a plurality of fin tubes 46. The fin tubes 46 are arranged in a manner such that one of rows of the heat dissipation fin sets 45 is located next to one of rows of the fin tubes 46 to form multiple rows of alternate insertion. In addition, in the embodiment, the upper reservoir 43 is provided with a plurality of first chambers 430 isolated from each other, and the first chambers 430 are arranged sequentially. The first one of the first chamber 430 is connected to the inlet 431, and the last one of the first chamber 430 is connected to the outlet 432. The lower reservoir 44 is provided with a plurality of second chambers 440 isolated from each other, and the second chambers 440 are arranged sequentially. The distribution ranges of the second chambers 440 and the first chambers 430 are respectively corresponded to each other. The fin tubes 46 form fluid communication between the second chambers 440 and the first chambers 430. The fin tubes 46 are in communication with the upper reservoir 43 and the lower reservoir 44 respectively so that an S-type flow path is collectively formed within the upper reservoir 43, the heat dissipation stacked structure 450 and the lower reservoir 44 (FIG. 8B).

As shown in FIG. 8A and FIG. 8B at the same time, when the working fluid gradually fills one of the first chambers 430, the working fluid passes through the corresponding one or more fin tubes 46 to flow downwardly into the corresponding one of the second chambers 440. When the working fluid is kept with a certain water pressure and volume, the working fluid flows in the second chamber 440 along a direction from the front end to the rear end of the tower type liquid cooling device 40, or be pushed to rise to the next one or the adjacent one of the first chambers 430 through the corresponding one or more fin tubes 46 again. In this way, after repeated descending and ascending processes, the working fluid can fully thermally exchange with the heat dissipation fin sets 45. The flow direction of the working fluid in the liquid cooling module 4 can be as shown by the solid arrow in FIG. 8B. However, it is noted, the actual flow situation will not be limited thereto, and the flow pattern may change depending on the situation.

As illustrated from the embodiment, the working fluid flowing out from the drain channel 23' is with relatively high temperature, so the working fluid in the front pipeline 41 will be relatively hot. Since the second chambers 440 are in communication with the fin tubes 46 only, so that the working fluid flowing in the first chambers 430, the fin tubes 46 and the second chambers 440 will then be pushed to the outlet 432, and the working fluid eventually flows to the rear pipeline 42 via the outlet 432. The working fluid in the rear pipeline 42 is with relatively low temperature, so that the working fluid can return to the liquid cooling head 2' for cooling down. The working fluid with a relatively low temperature in the rear pipeline 42 can then be cooled down by receiving the external airflow (as shown by the hollow arrow in FIG. 8B) via the air inlet side of the liquid cooling module 4, thereby improving the heat dissipation effect.

FIG. 9 illustrates an appearance view of the liquid cooling module 4 from which the outer casing 400 is detached. As shown in FIG. 9, the liquid cooling module 4 can be collocated with the external fan 50, and the external fan 50 is disposed on one side of the heat dissipation stacked structure 450 to be fixed between the upper reservoir 43 and the lower reservoir 44 for outputting airflow towards heat dissipation fin sets 45. The best position of the external fan 50 is an exposed portion of the heat dissipation fin sets 45 above the first inlet channel 21'. In other words, the external fan 50 and the first water inlet channel 21' of the liquid cooling head 2' are both located on the same side of the liquid cooling module 4.

It is noted that the above-mentioned liquid cooling head of the present disclosure may be, for example, a water cooling head, and the liquid cooling module may be, for example, a water cooling module. However, the present disclosure is not limited to this.

Thus, through the construction of the embodiments above, In addition to achieving good heat dissipation efficiency, the present disclosure is also beneficial to be applied to related computer equipment, host or server equipment.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A liquid cooling head, comprising:
a chassis comprising a housing, a blocking plate and a base which are assembled together in sequence, the housing formed with a first side and a second side which are opposite to each other, wherein an upper chamber is formed between the housing and the blocking plate, a lower chamber is formed between the blocking plate and the base, and a connection opening is formed on the blocking plate and communicated with the upper chamber and the lower chamber that are stacked with each other;
a first inlet channel disposed on the first side of the housing and communicated with the upper chamber for feeding a working fluid into the upper chamber from a first source;
a thermally-conducting structure disposed within the lower chamber and sandwiched between the blocking plate and the base for radiating heat of the working fluid away, and the thermally-conducting structure comprising a plurality of fins arranged abreast sequentially;
a liquid gathering structure disposed within the lower chamber for gathering the working fluid passed through the thermally-conducting structure, the liquid gathering structure comprising a circular body and three flow channels, the circular body disposed on one inner surface of the base, and the three flow channels respectively formed on a circular surface of the circular body facing towards the housing for respectively receiving the working fluid sent from the fins;
a drain channel disposed on one of the first side and the second side of the housing and communicated with the lower chamber; and
a pump set for pushing the working fluid in the lower chamber to discharge the working fluid outwards from the drain channel.

2. The liquid cooling head of claim 1, further comprising:
a second inlet channel disposed on the second side of the housing and communicated with the upper chamber for feeding another working fluid into the upper chamber from a second source, wherein the first inlet channel and the second inlet channel are oppositely arranged on the housing.

3. The liquid cooling head of claim 1, wherein the first inlet channel and the drain channel are arranged on the first side of the housing; or
the first inlet channel and the drain channel are oppositely disposed on the housing.

4. The liquid cooling head of claim 1, wherein the blocking plate further comprises at least one communication slit arranged between the connection opening and the first inlet channel and communicated with the upper chamber and the lower chamber.

5. The liquid cooling head of claim 1, wherein the base is formed with a first flow-diverting structure and a second flow-diverting structure, wherein the fins, the liquid gathering structure, the first flow-diverting structure and the second flow-diverting structure are collectively formed on the one inner surface of the base facing towards the housing; and
the first flow-diverting structure and the second flow-diverting structure are disposed on a same side of the thermally-conducting structure for respectively diverting the working fluid passing through the fins to the liquid gathering structure, wherein the liquid gathering structure is disposed between the first flow-diverting structure and the second flow-diverting structure.

6. The liquid cooling head of claim 1, wherein the pump set comprises a drive assembly and a fan blade assembly, the drive assembly is allowed to rotate the fan blade assembly with a contactless way;
the fan blade assembly comprises a fan blade and a shaft rod passing through the fan blade, the housing comprises a partition sheet, the liquid gathering structure comprises a shaft-rod holder, the shaft-rod holder is located at an intersection of the flow channels, the partition sheet is sandwiched between the circular body and the fan blade to cover the flow channels, and the partition sheet is formed with a through hole, and the shaft rod passes through the through hole to be fixed on the shaft-rod holder; and the housing is formed with an upper cavity and a lower cavity at two opposite surfaces of the housing, respectively, the upper cavity and the lower cavity are vertically aligned with each other and hermetically isolated, wherein the drive assembly is received within the upper cavity, the fan blade assembly is received within the lower cavity and rotatably disposed in the shaft holder and the lower cavity.

7. The liquid cooling head of claim 1, further comprising:

two external channels respectively located at the first side and the second side of the housing for sending one another working fluid inside and outside from a third source; and a pipeline disposed within the upper chamber and connected to the external channels and hermetically isolated to the upper chamber.

8. The liquid cooling head of claim 7, wherein the blocking plate is formed with a groove, and the housing is formed with a pipe cover covering the groove to collectively form the pipeline.

9. The liquid cooling head of claim 8, wherein the housing comprises a position-limited recess disposed within the upper chamber and concavely formed on an inner surface of the housing facing towards the blocking plate; and the chassis further comprises a position-limited rib monolithically connected to an outer surface of the pipe cover and extending into the position-limited recess for positioning the pipe cover.

10. A liquid cooling module, comprising:

the liquid cooling head of claim 1; and a tower type liquid cooling device, comprising:

an upper reservoir comprising an inlet, an outlet and a plurality of first chambers, one of the first chambers that is connected to the inlet, another of the first chambers that is connected to the outlet;

a lower reservoir vertically stacked on a top portion of the liquid cooling head, and the lower reservoir comprising a plurality of second chambers that are isolated to each other; and a heat dissipation stacked structure comprising a plurality of heat dissipation fin sets and a plurality of fin tubes which are sandwiched between the upper reservoir and the lower reservoir, and the fin tubes being parallel to each other and sandwiched between two neighboring ones of the heat dissipation fin sets, wherein the fin tubes are in communication with the upper reservoir and the lower reservoir respectively so that an S-type flow path is collectively formed within the upper reservoir, the heat dissipation stacked structure and the lower reservoir;

a front pipeline that is in communication with the inlet and the drain channel of the liquid cooling head; and a rear pipeline that is in communication with the outlet and the first inlet channel of the liquid cooling head.

11. The liquid cooling module of claim 10, wherein the tower type liquid cooling device further comprises an external fan located on one side of the heat dissipation stacked structure and fixed between the upper reservoir and the lower reservoir for outputting airflow towards the heat dissipation fin sets.

12. The liquid cooling module of claim 11, wherein the external fan and the first inlet channel of the liquid cooling head are collectively disposed on a same side of the liquid cooling module.

13. The liquid cooling module of claim 10, further comprising an outer casing, and the outer casing that is formed with an inclined plate expanding obliquely and outwardly at one side surface of the outer casing corresponding to the first inlet channel.

* * * * *